(12) United States Patent
Fujihara et al.

(10) Patent No.: US 11,923,154 B2
(45) Date of Patent: Mar. 5, 2024

(54) TRIGGER SWITCH

(71) Applicant: OMRON Corporation, Kyoto (JP)

(72) Inventors: Takumi Fujihara, Kyoto (JP); Ryoji Shimizu, Kyoto (JP); Kohei Fujio, Kyoto (JP); Akihiro Ishii, Kyoto (JP); Taiki Koyama, Kyoto (JP); Kazushi Maeta, Kyoto (JP)

(73) Assignee: OMRON Corporation, Kyoto (JP)

( * ) Notice: Subject to any disclaimer, the term of this patent is extended or adjusted under 35 U.S.C. 154(b) by 166 days.

(21) Appl. No.: 17/552,516

(22) Filed: Dec. 16, 2021

(65) Prior Publication Data
US 2022/0246370 A1    Aug. 4, 2022

(30) Foreign Application Priority Data
Feb. 2, 2021 (JP) .................................. 2021-015115

(51) Int. Cl.
*H01H 13/14* (2006.01)
*H01H 13/20* (2006.01)
*H03K 17/975* (2006.01)

(52) U.S. Cl.
CPC ............ *H01H 13/14* (2013.01); *H01H 13/20* (2013.01); *H03K 17/975* (2013.01)

(58) Field of Classification Search
CPC ...... H01H 3/125; H01H 13/705; H01H 13/14; H01H 13/04; H01H 13/10; H01H 13/70; H01H 13/704; H01H 13/7065; H01H 13/7006; H01H 13/7057; H01H 13/78; H01H 13/79; H01H 13/52; H01H 13/703; H01H 13/507; H01H 3/12; H01H 13/20
See application file for complete search history.

(56) References Cited

U.S. PATENT DOCUMENTS

2013/0161163 A1* 6/2013 Nakamura ............. H03K 17/98
                                                    200/16 R

FOREIGN PATENT DOCUMENTS

WO         2020/231974 A1    11/2020

* cited by examiner

*Primary Examiner* — Ahmed M Saeed
(74) *Attorney, Agent, or Firm* — METROLEX IP LAW GROUP, PLLC

(57) ABSTRACT

A trigger switch according to one or more embodiments may include a first conductive plate (movable electrode) movable in response to movement of a trigger receiving a depressing operation, and a second fixed electrode (fixed electrode) located adjacent to a movable range of the first conductive plate with a space in between. The second fixed electrode forms a capacitor together with the first conductive plate. The capacitor formed by the first conductive plate and the second fixed electrode has a capacitance that changes as the first conductive plate moves.

15 Claims, 12 Drawing Sheets

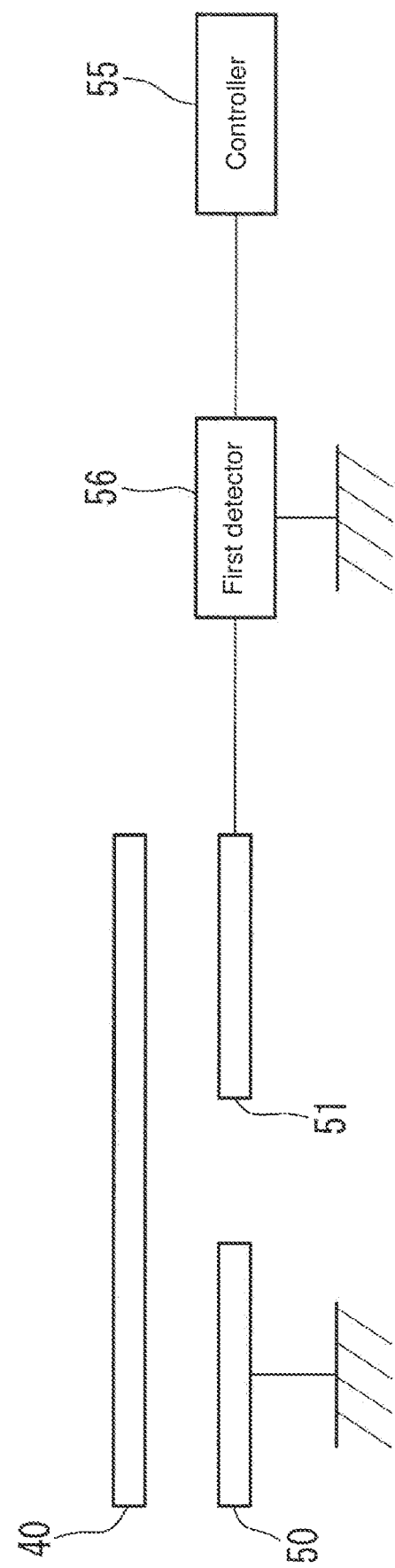

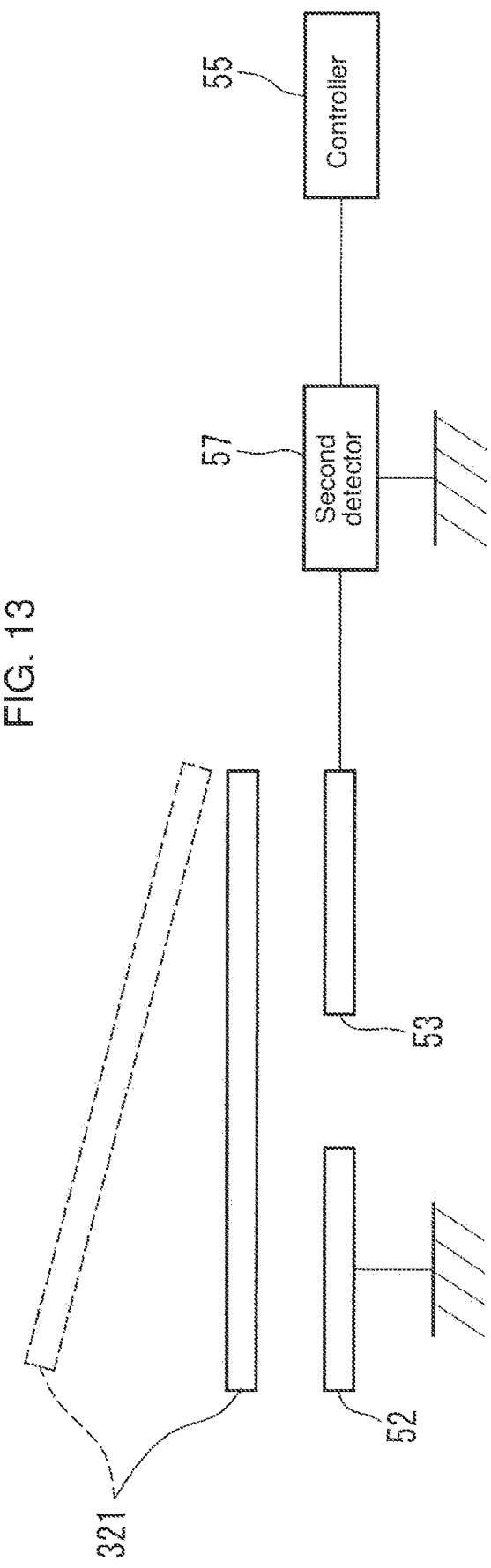

TRIGGER SWITCH

CROSS-REFERENCE TO RELATED APPLICATION

This application claims priority to Japanese Patent Application No. 2021-015115 filed on Feb. 2, 2021, the contents of which are incorporated herein by reference.

FIELD

The disclosure relates to a trigger switch that moves in response to a depressing operation on a trigger.

BACKGROUND

A trigger switch is used to control the operation of a power tool in response to a depressing operation. For example, Patent Literature 1 describes a trigger switch including a trigger and a magnetic sensor to detect an amount by which the trigger is depressed. The trigger switch described in Patent Literature 1 includes the magnetic sensor to contactlessly detect the depression amount of the trigger and have a longer service life.

CITATION LIST

Patent Literature

Patent Literature 1: WO 2020/231974

SUMMARY

The trigger switch including the magnetic sensor described in Patent Literature 1 may be incorporated in a power tool. During an operation of the power tool, the trigger switch may operate erroneously under the influence of a changing magnetic field in the external environment. For example, such a trigger switch incorporated in a power tool may be used near a crane including a strong electromagnet for gripping iron scrap, or near a source of magnetic field forces, for example, a motor in the power tool. The trigger switch may operate erroneously under the influence of magnetic field forces from such sources.

One or more embodiments are directed to a trigger switch that may detect a depression amount of a trigger contactlessly and that may remain unaffected by a magnetic field in an external environment.

A trigger switch according to one or more embodiments may include a trigger movable in response to a depressing operation, a movable electrode movable in response to movement of the trigger receiving the depressing operation, and a fixed electrode located adjacent to a movable range of the movable electrode. The fixed electrode forms a capacitor together with the movable electrode. The capacitor formed by the movable electrode and the fixed electrode has a capacitance changing as the movable electrode moves.

In the trigger switch, the fixed electrode has a shape to allow an electrode area forming a capacitor to change in accordance with a position of the movable electrode in the movable range of the movable electrode.

In the trigger switch, the fixed electrode has a shape to allow the electrode area forming a capacitor to gradually increase in a direction of movement in response to the depressing operation.

The trigger switch may further include an operation member movable in response to an operation, a sub-movable electrode movable in response to movement of the operation member, and a sub-fixed electrode that forms a capacitor together with the sub-movable electrode in response to the sub-movable electrode moving to a position adjacent to the sub-fixed electrode. The sub-movable electrode moves in response to movement of the operation member in a movable range between a position at which the sub-movable electrode forms a capacitor together with the sub-fixed electrode and a position at which the sub-movable electrode does not form the capacitor together with the sub-fixed electrode.

The trigger switch may further include an output unit incorporatable into an electric device including a drive drivable in response to an electric signal. The output unit outputs an electric signal to drive the drive with an output determined by a capacitance of the capacitor formed by the movable electrode and the fixed electrode.

In the trigger switch according to one or more embodiments, the capacitance changes in response to a depressing operation.

The trigger switch according to one or more embodiments may include the movable electrode that moves in response to a depressing operation on the trigger, and the fixed electrode that forms a capacitor together with the movable electrode. The capacitor formed by the movable electrode and the fixed electrode has a capacitance that changes as the movable electrode moves. The trigger switch according one or more embodiments may thus detect a depression amount of the trigger through a capacitance and may be, for example, unaffected by a magnetic field in the external environment.

BRIEF DESCRIPTION OF THE DRAWINGS

FIG. 10 is a block diagram conceptually illustrating an example of a first capacitor formed in a trigger switch according to one or more embodiments.

FIG. 13 is a block diagram conceptually illustrating an example of a second capacitor formed in a trigger switch according to one or more embodiments.

DETAILED DESCRIPTION

One or more embodiments are described with reference to the drawings.

Example Use

A trigger switch according to an embodiment of the present disclosure is usable in various electric devices such as electric drills, electric saws, electric screwdrivers, electric wrenches, electric grinders, and other power tools including a motor or another drive. In one or more embodiments below, a trigger switch TS will be described with reference to the drawings.

Embodiments

Figure 1:
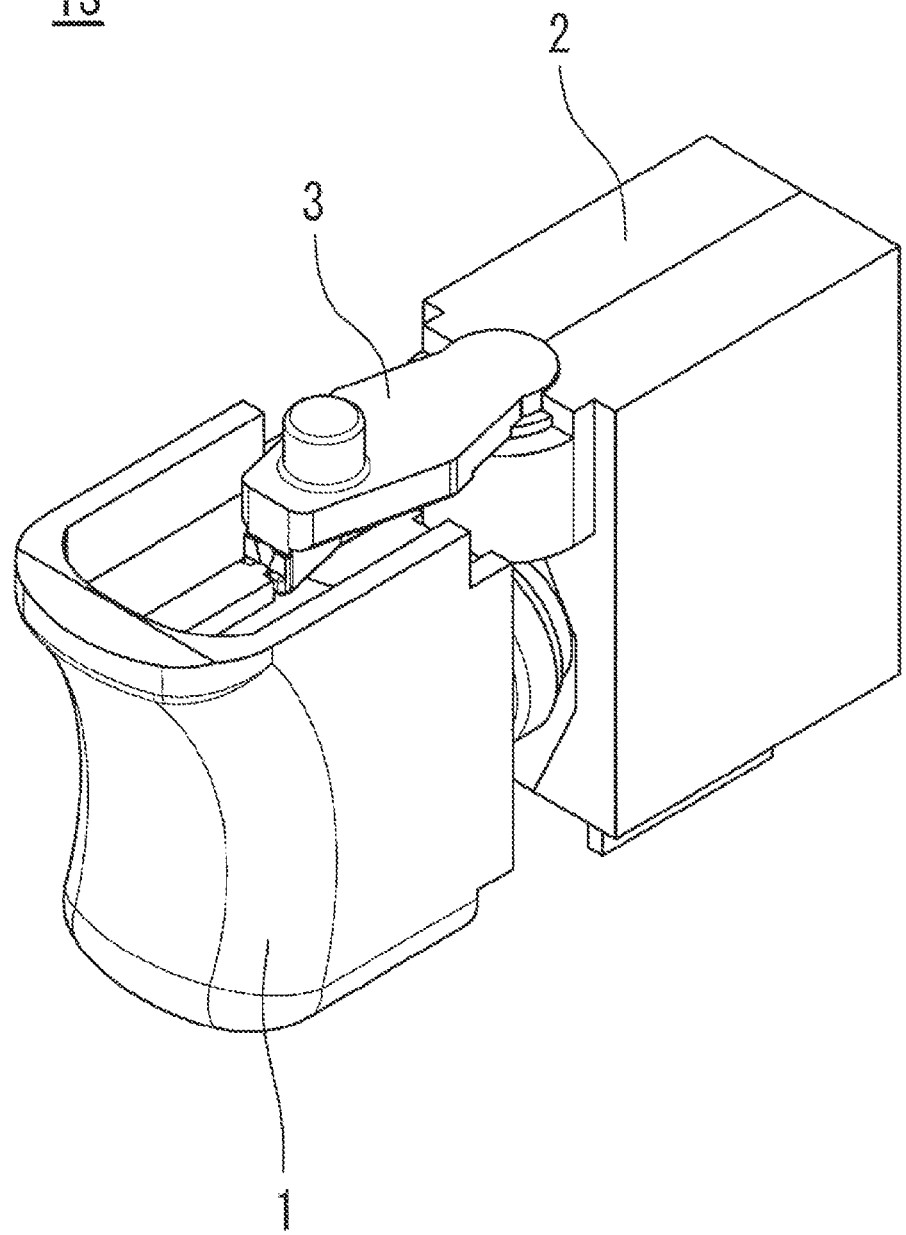
FIG. 1 is a diagram illustrating a schematic perspective view of a trigger switch according to one or more embodiments, showing an example appearance.

FIG. 1 is a schematic perspective view of a trigger switch TS according to an embodiment or embodiments of the present disclosure, showing an example appearance. FIG. 1 shows the appearance of the trigger switch TS that can be incorporated into an electric device ET (refer to FIG. 14), such as a power tool. The trigger switch TS is operable by a user of the electric device ET. The user depresses a trigger 1 in the trigger switch TS to drive a drive M (refer to FIG. 14), such as an electric motor, incorporated in the electric device ET. The trigger switch TS includes a substantially rectangular housing 2 and the trigger 1. The housing 2 is incorporated in the electric device ET. The trigger 1 can be depressed by the user. The trigger switch TS further includes a switch lever 3 (operation member) operable for switching the driving direction of the drive M, for example, the rotation direction of an electric screwdriver between the forward rotation and the reverse rotation. For ease of explanation, the orientation of the trigger switch TS in the drawing is hereafter defined as the front for the left portion facing a viewer in FIG. 1, the rear for the right portion facing away from the viewer, the front for the left portion facing the viewer in which the trigger 1 is attached, and the rear for the portion close to the housing 2, or the right portion facing away from the viewer, for convenience. However, the described orientation does not limit the orientation of the trigger switch TS in use. The housing 2 includes a front half and a rear half joined together, and incorporates various components.

Figure 2:
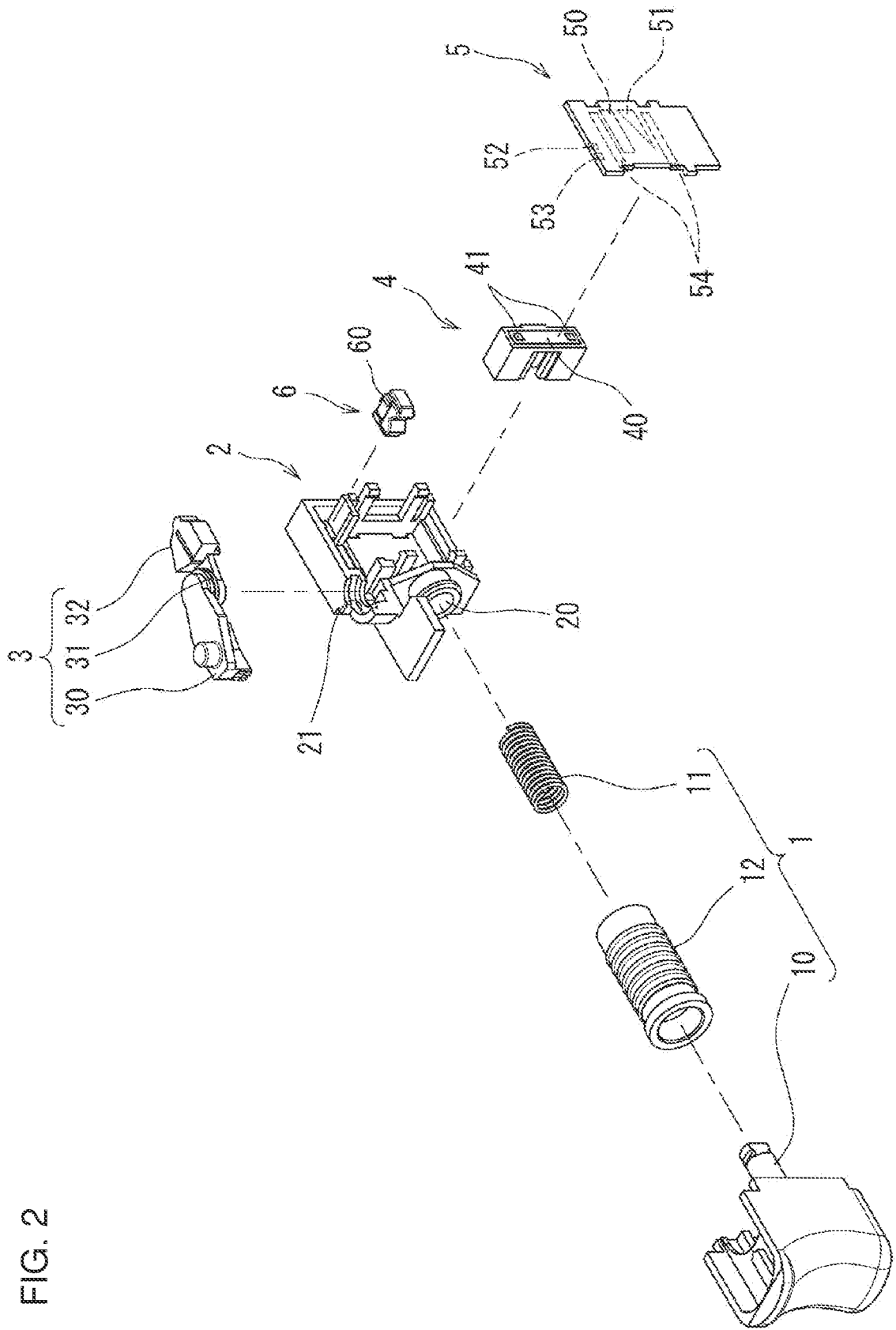
FIG. 2 is a diagram illustrating a schematic exploded perspective view of a trigger switch according to one or more embodiments.
Figure 3:
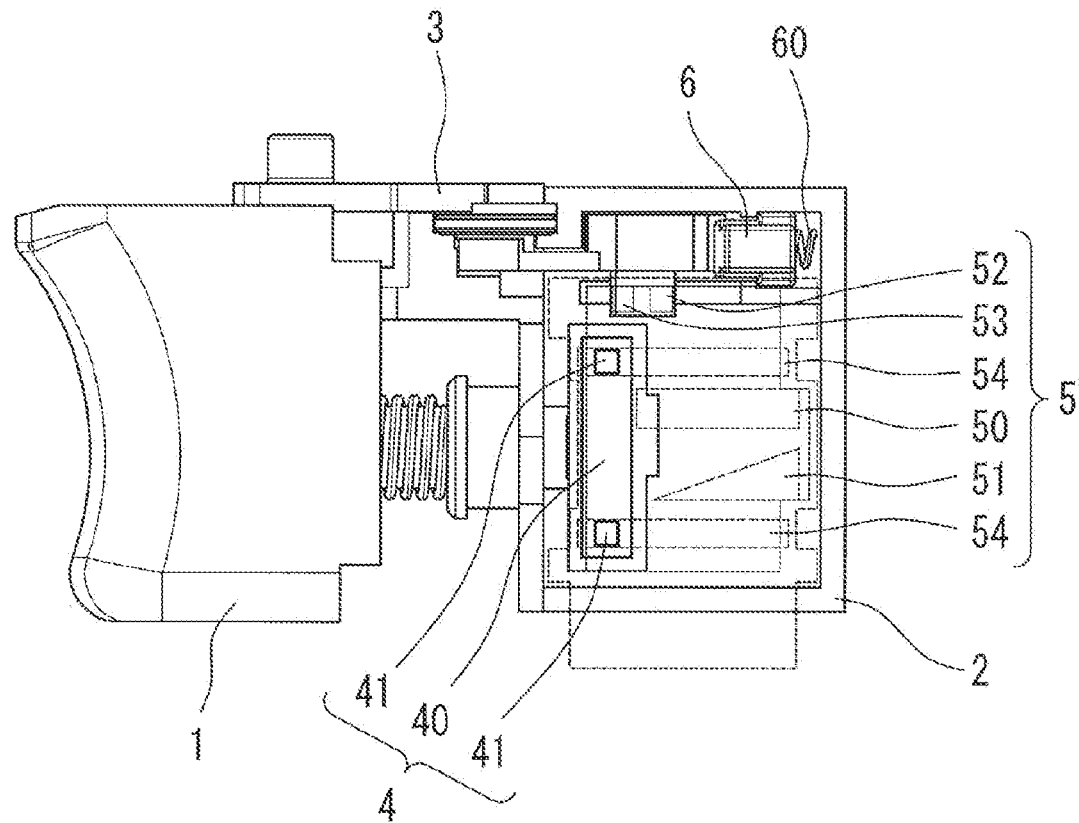
FIG. 3 is a diagram illustrating a schematic side view of a trigger switch according to one or more embodiments.

The internal structure of the trigger switch TS will now be described. FIG. 2 is a schematic exploded perspective view of the trigger switch TS according to one or more embodiments. FIG. 3 is a schematic side view of the trigger switch TS according to one or more embodiments. To facilitate visual recognition of the internal structure, FIGS. 2 and 3 show the housing 2 without showing a front half thereof located in the portion facing the viewer in the figures. The housing 2 accommodates various components such as a movable member 4, a fixed member 5, and an engagement member 6, in addition to a part of the trigger 1 and a part of the switch lever 3. FIGS. 2 and 3 show the fixed member 5 partly seen through.

The trigger 1 included in the trigger switch TS includes a shaft 10 extending toward the housing 2. The shaft 10 is an elongated cylinder extending into the housing 2 through a through-hole 20 in a left wall of the housing 2. The shaft 10 receives a first urging member 11 wound around it. The first urging member 11 serves as a return spring and may be a compressed coil spring. The first urging member 11 has a left end thereof in contact with the trigger 1, and a right end thereof in contact with a wall of the housing 2 to urge the trigger 1 leftward. The first urging member 11 is covered with a flexible cover 12. In response to a depressing operation on the trigger 1, the trigger 1 and the shaft 10 move rightward, or in a depressing direction. In response to the depressing operation being released, the trigger 1 and the shaft 10 move leftward as the first urging member 11 urges the trigger 1 and the shaft 10 leftward, opposite to the depressing direction of the trigger 1.

The trigger 1 accommodated in the housing 2 receives the movable member 4 at a right end thereof, toward which the shaft 10 is depressed. The movable member 4 is substantially rectangular. The movable member 4 having a left side surface thereof attached to the shaft 10 moves in the depressing direction as the trigger 1 moves upon receiving a depressing operation. The movable member 4 has a substantially rectangular first conductive plate 40 (movable electrode) attached to the front surface. The first conductive plate 40 is a conductor including a conductive metal plate. The first conductive plate 40 is vertically elongated and rectangular as viewed from the front. The first conductive plate 40 includes separators 41 attached to upper and lower portions of a front surface thereof. The separators 41 serve as spacers to separate the first conductive plate 40 from the fixed member 5. The separators 41 in contact with the fixed member 5 prevent the first conductive plate 40 from coming in contact with the fixed member 5. As the movable member 4 moves, the separators 41 in contact with the fixed member 5 slide on the fixed member 5. The separators 41, which do not affect a capacitance, may be formed from insulators, conductors, or other various materials.

Figure 4A:
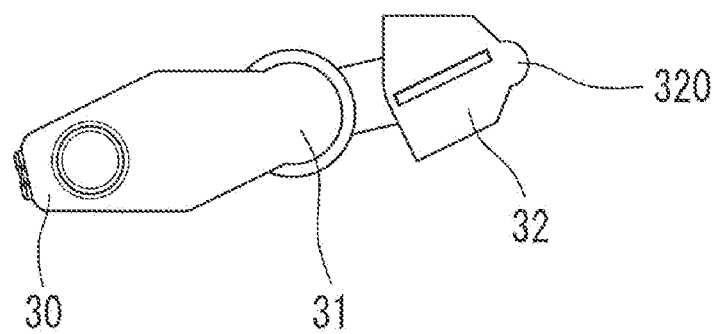
FIG. 4A is a diagram illustrating a schematic plan view of a switch lever in a trigger switch according to one or more embodiments, showing an example appearance.
Figure 4B:
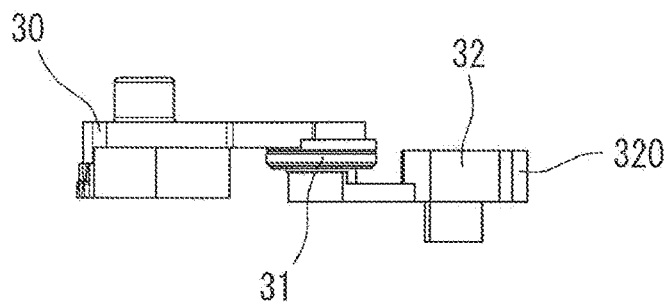
FIG. 4B is a diagram illustrating a schematic front view of a switch lever in a trigger switch according to one or more embodiments, showing an example appearance.

FIG. 4A is a schematic plan view of the switch lever 3 in the trigger switch TS according to one or more embodiments, showing an example appearance. FIG. 4B is a schematic front view of the switch lever 3 in the trigger switch TS according to one or more embodiments, showing an example appearance. The switch lever 3 will now be described with reference to FIGS. 2, 3, 4A, and 4B. The switch lever 3 includes a lever 30 to receive a swinging operation performed by a user, a swinging shaft 31 serving as an axis of swinging, and an action part 32 movable in response to the swinging operation. The switch lever 3 is swingably supported by the swinging shaft 31 through a support hole 21 formed in the upper surface of the housing 2. The lever 30 is attached to an upper end of the swinging shaft 31 and extends leftward above the housing 2. The action part 32 accommodated in the housing 2 is attached to a lower end of the swinging shaft 31 and extends rightward. The action part 32 is a substantially rounded pentagon as viewed from above. The action part 32 includes a semicircular engagement protrusion 320 to engage with the engagement member 6 at a right tip thereof. The action part 32 includes a substantially rectangular second conductive plate 321 (sub-movable electrode) attached to a lower surface thereof. The second conductive plate 321 is a conductor including a conductive metal piece.

As shown in FIGS. 2 and 3, the engagement member 6 engageable to the switch lever 3 is located on the right of the switch lever 3 as a pusher to press the switch lever 3 leftward. The engagement member 6 has a left end facing the switch lever 3. The left end surface forms an M-shape as viewed in plan. The engagement member 6 has, in a right portion thereof, a second urging member 60, such as a compressed spring, to urge the engagement member 6 as a pusher spring.

The switch lever 3 swings in response to a swinging operation performed by a user. The switch lever 3 is pressed by the engagement member 6 urged by the second urging member 60. The engagement protrusion 320 on the switch lever 3 is pressed by the engagement member 6 to engage with an M-shaped recess in the left end surface or a side portion of the engagement member 6. Thus, the switch lever 3 is held at a position to which the switch lever 3 has swung.

Figure 5:
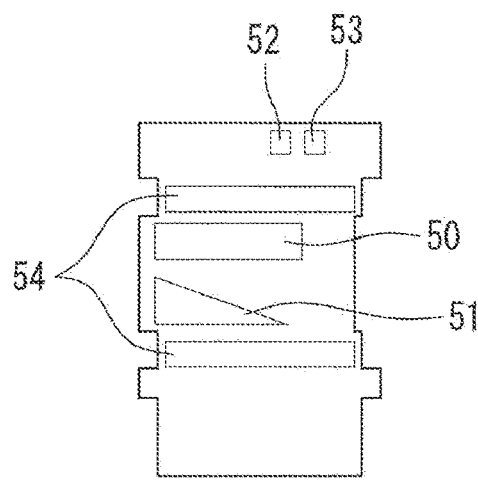
FIG. 5 is a diagram illustrating a schematic rear view of a fixed member in a trigger switch according to one or more embodiments, showing an example appearance.
Figure 6:
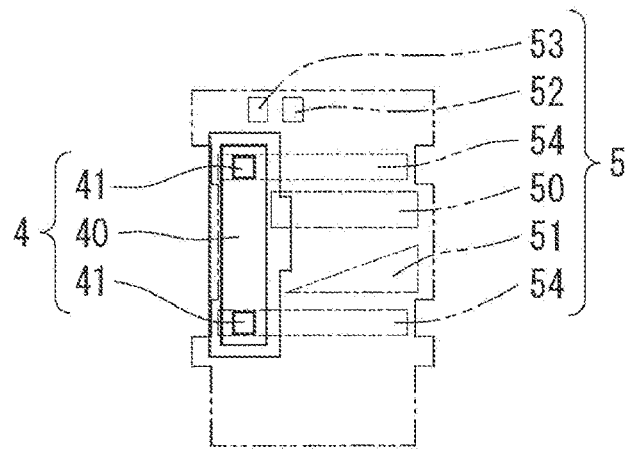
FIG. 6 is a diagram illustrating a schematic front view of a movable member and a fixed member in a trigger switch according to one or more embodiments, showing an example appearance.

FIG. 5 is a schematic rear view of the fixed member 5 in the trigger switch TS according to one or more embodiments, showing an example appearance. FIG. 6 is a schematic front view of the movable member 4 and the fixed member 5 in the trigger switch TS according to one or more embodiments, showing their example appearance. FIG. 6 shows the fixed member 5 seen through to facilitate visual recognition of the positional relationship with respect to the movable member 4. The fixed member 5 will now be described with reference to FIGS. 2, 3, 5, and 6. The fixed member 5 is a substantially rectangular substrate. The fixed member 5 as a substrate includes components forming an electronic circuit, such as various circuits, elements, and wiring, mounted on or connected to a front surface thereof. More specifically, the components include a controller 55 (refer to FIG. 10) described later, a first detector 56 (refer to FIG. 10), a second detector 57 (refer to FIG. 13), and an output unit 58 (refer to FIG. 14). The fixed member 5 includes, on a rear surface thereof, a first fixed electrode 50 and a second fixed electrode 51 (fixed electrodes), a third fixed electrode 52 and a fourth fixed electrode 53 (sub-fixed electrodes), and two guides 54.

The first fixed electrode 50 and the second fixed electrode 51 are aligned vertically near the center of the fixed member 5 above and below the center. The upper first fixed electrode 50 is a rectangular conductive thin metal plate extending in the lateral direction, or in a moving direction of the movable member 4, which moves as the trigger 1 moves. The lower second fixed electrode 51 is a right-triangular conductive thin metal plate extending in the lateral direction, or in the moving direction of the movable member 4. The second fixed electrode 51 is triangular with a vertical length thereof gradually increasing rightward, or in a direction in which the movable member 4 moves in response to the depressing operation. The first fixed electrode 50 and the second fixed electrode 51 form a first capacitor together with the first conductive plate 40 in the adjacent movable member 4. The triangular second fixed electrode 51 has an electrode area forming a capacitor that gradually increases in a direction in which the first conductive plate 40 moves in response to a depressing operation.

The two guides 54 are respectively formed above the first fixed electrode 50 and below the second fixed electrode 51. The two guides 54 extending in the lateral direction, or in the moving direction of the movable member 4, are, for example, grooves into which the separators 41 is loosely fittable. The guides 54 guide a lateral movement of the movable member 4 with the upper and lower separators 41 in contact with the guides 54.

The third fixed electrode 52 and the fourth fixed electrode 53 are laterally aligned near the upper end of the fixed member 5. The square third fixed electrode 52 is located on the right. The square fourth fixed electrode 53 is located on the left. The third fixed electrode 52 and the fourth fixed electrode 53, when moving to a position adjacent to the second conductive plate 321 in the switch lever 3, form a second capacitor together with the second conductive plate 321.

Figure 7:
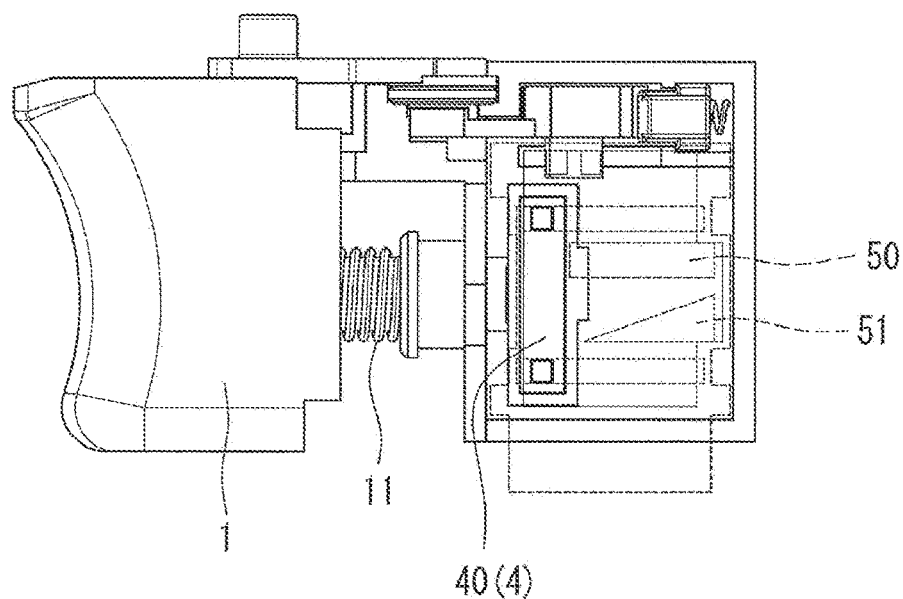
FIG. 7 is a diagram illustrating a schematic side view of a trigger switch according to one or more embodiments.
Figure 8:
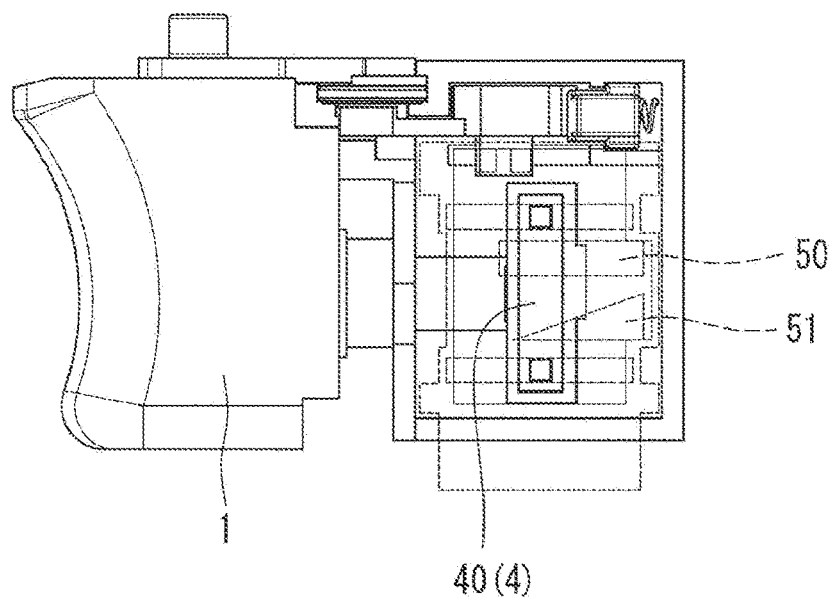
FIG. 8 is a diagram illustrating a schematic side view of a trigger switch according to one or more embodiments.
Figure 9:
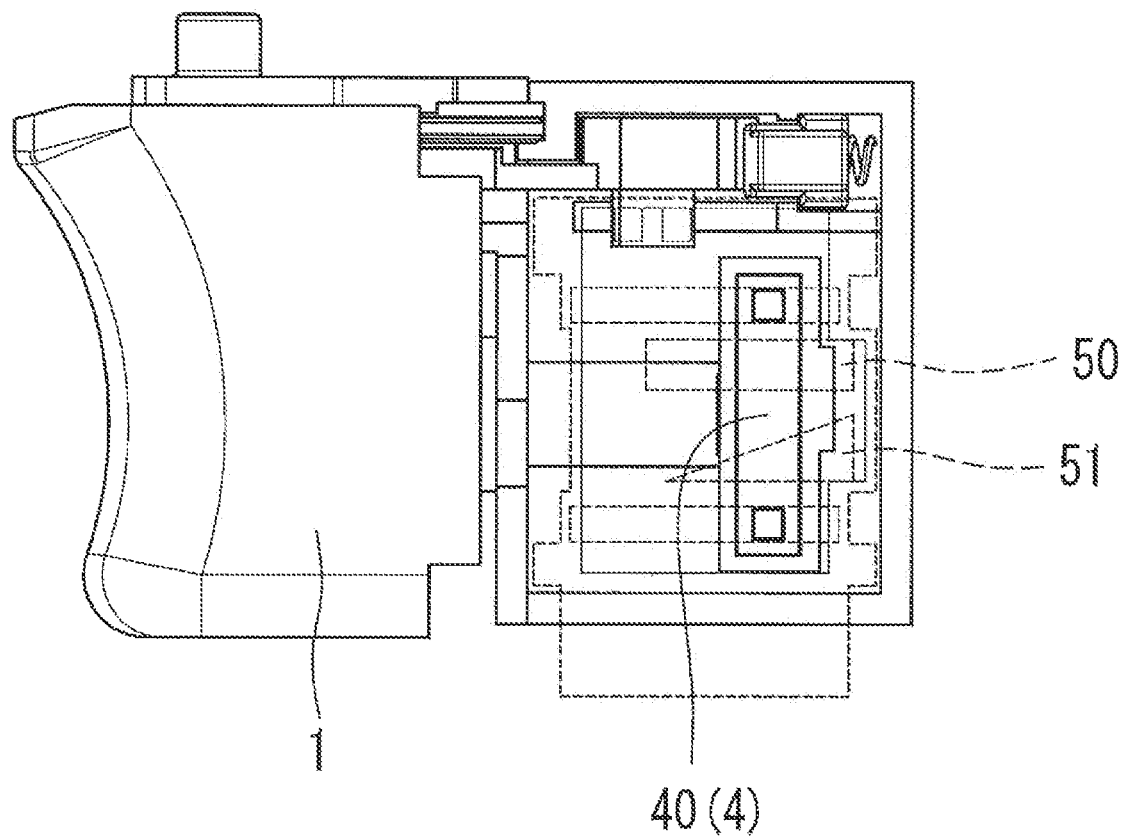
FIG. 9 is a diagram illustrating a schematic side view of a trigger switch according to one or more embodiments.

The operation of the trigger switch TS according to one or more embodiments will now be described. FIGS. 7 to 9 are schematic side views of the trigger switch TS according to one or more embodiments. FIGS. 7 to 9 show the fixed member 5 partially seen through without showing the front half of the housing 2.

FIG. 7 shows the trigger switch TS including the trigger 1 that is not depressed. The trigger 1 that is not depressed is urged by the first urging member 11 and is at a leftmost position in a movable range thereof. The movable member 4 attached to the shaft 10 in the trigger 1 is similarly at the leftmost position in a movable range thereof. When the movable member 4 is at the leftmost position in the movable range as shown in FIG. 7, the first fixed electrode 50 and the second fixed electrode 51 are away from a position adjacent to the first conductive plate 40 attached to the movable member 4. Thus, the first conductive plate 40 does not form any capacitor having a sufficient capacitance together with the first fixed electrode 50 and the second fixed electrode 51.

FIG. 8 shows the state of the trigger 1 receiving a depressing operation, previously in the state in FIG. 7. In response to the depressing operation on the trigger 1, the trigger 1 moves rightward, or in the depressing direction. As the trigger 1 moves upon receiving the depressing operation, the movable member 4 moves rightward. In the state in FIG. 8, the first fixed electrode 50 and the second fixed electrode 51 are at a position adjacent to the first conductive plate 40 attached to the movable member 4, allowing the first conductive plate 40 to form the first capacitor together with the first fixed electrode 50 and the second fixed electrode 51.

FIG. 9 shows the state of the trigger 1 receiving an additional depressing operation, previously in the state in FIG. 8. The trigger 1 in the state in FIG. 8 receives the depressing operation to move further rightward. As the trigger 1 moves upon receiving the depressing operation, the movable member 4 in the state in FIG. 8 moves further rightward. In the state in FIG. 9, the first fixed electrode 50 and the second fixed electrode 51 are at a position adjacent to the first conductive plate 40 attached to the movable member 4, allowing the first conductive plate 40 to form the first capacitor together with the first fixed electrode 50 and the second fixed electrode 51. The second fixed electrode 51 forming the first capacitor together with the first conductive plate 40 has a larger electrode area in the state in FIG. 9 than that in the state in FIG. 8. The larger electrode area increases the capacitance of the first capacitor formed by the first conductive plate 40 and the second fixed electrode 51.

In response to the user releasing the depressing operation on the trigger 1, the urging force from the first urging member 11 urges the trigger 1 leftward, or in a direction opposite to the depressing direction, thus returning the trigger 1 to the state in FIG. 7.

FIG. 10 is a block diagram conceptually showing an example of the first capacitor formed in the trigger switch TS according to one or more embodiments. The substrate as the fixed member 5 receives the controller 55 including a microcomputer, and the first detector 56 to detect a capacitance, both are mounted on or connected to the front surface of the fixed member 5. The first fixed electrode 50 is connected to the ground. The second fixed electrode 51 is connected to the first detector 56 to detect a capacitance. The first detector 56 is connected to the second fixed electrode 51 and the ground. The first detector 56 detects a capacitance of the first capacitor and outputs an electric signal indicating the detected capacitance to the controller 55. The first fixed electrode 50 adjacent to the first conductive plate 40 forms a capacitor together with the first conductive plate 40. The second fixed electrode 51 adjacent to the first conductive plate 40 forms a capacitor together with the first conductive plate 40. Hereafter, C1 is a capacitance of the capacitor formed by the first fixed electrode 50 and the first conductive plate 40, and C2 is a capacitance of the capacitor formed by the second fixed electrode 51 and the first conductive plate 40. The first capacitor, which is a synthetic capacitor, serves as an element including the capacitor having the capacitance C1 and the capacitor having the capacitance C2 connected with each other in series, and C12, a capacitance of the first capacitor, is written by the Formula 1 below.

$$C12=(C1 \times C2)/(C1+C2) \quad (1)$$

where C12 is the capacitance of the first capacitor,

C1 is the capacitance of the capacitor formed by the first fixed electrode 50 and the first conductive plate 40, and C2 is the capacitance of the capacitor formed by the second fixed electrode 51 and the first conductive plate 40.

The electrode area of the second fixed electrode 51 forming a capacitor together with the first conductive plate 40 gradually increases in the direction in which the movable member 4 moves in response to a depressing operation. The capacitance C2 thus gradually increases as the movable member 4 moves. As the capacitance C2 increases, the capacitance C12 of the first capacitor increases as described by Formula 1.

Figure 11A:
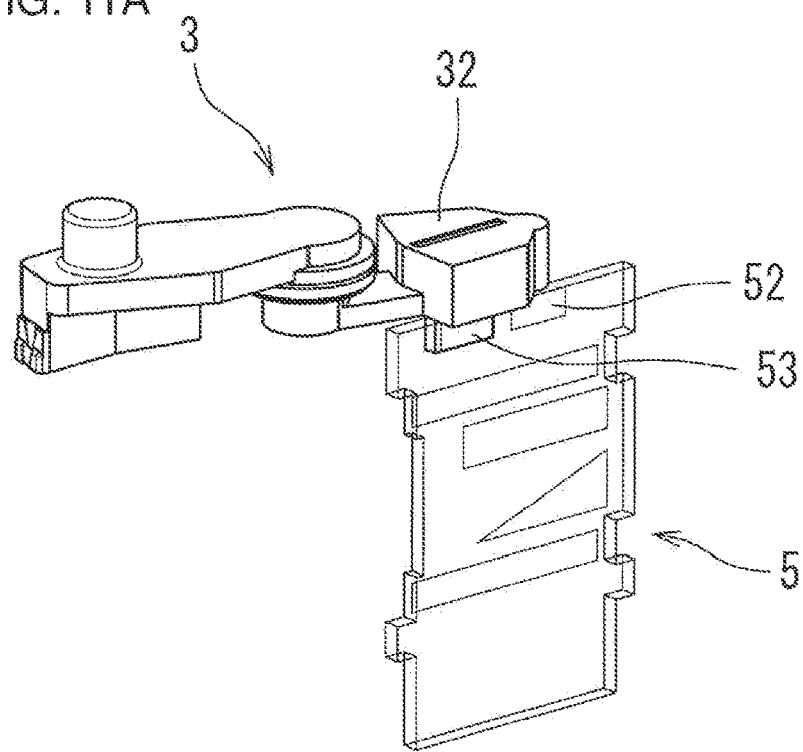
FIG. 11A is a diagram illustrating a schematic overview of a switch lever and a fixed member in a trigger switch according to one or more embodiments, showing an example appearance.
Figure 11B:
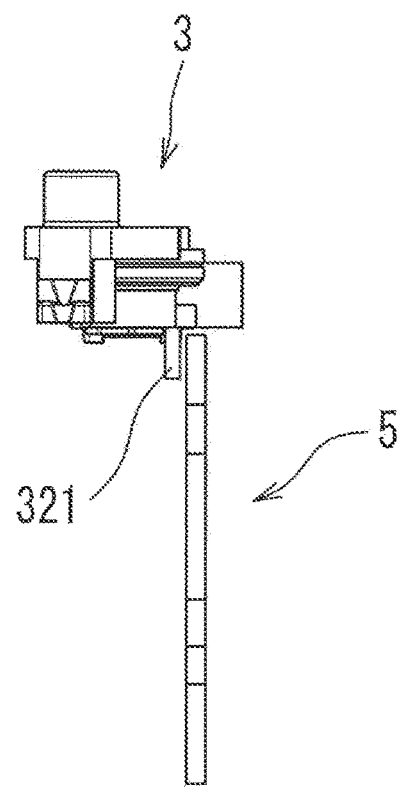
FIG. 11B is a diagram illustrating a schematic overview of a switch lever and a fixed member in a trigger switch according to one or more embodiments, showing an example appearance.

FIGS. 11A and 11B, and FIGS. 12A and 12B are schematic overviews of the switch lever 3 and the fixed member 5 in the trigger switch TS according to one or more embodiments, showing their example appearance. FIG. 11A is a schematic perspective view of the switch lever 3 and the fixed member 5. FIG. 11B is a schematic left side view of the switch lever 3 and the fixed member 5. In FIGS. 11A and 11B, in response to the switch lever 3 being swung rightward (clockwise) as viewed in plan, the second conductive plate 321 attached to the lower surface of the action part 32 in the switch lever 3 is located adjacent to the fixed member 5. In the state in FIGS. 11A and 11B, the second conductive plate 321 forms a second capacitor together with the third fixed electrode 52 and the fourth fixed electrode 53.

Figure 12A:
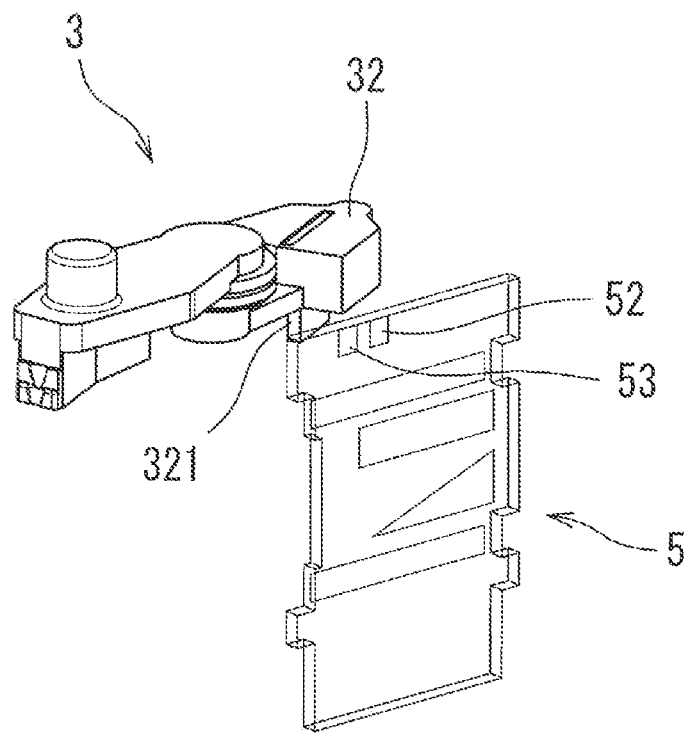
FIG. 12A is a diagram illustrating a schematic overview of a switch lever and a fixed member in a trigger switch according to one or more embodiments, showing an example appearance.
Figure 12B:
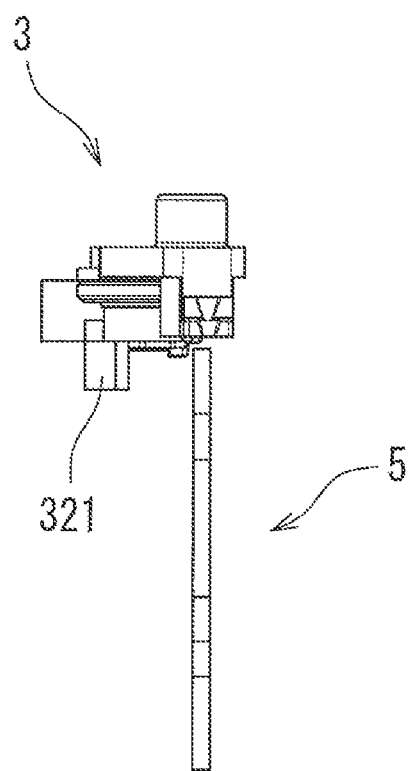
FIG. 12B is a diagram illustrating a schematic overview of a switch lever and a fixed member in a trigger switch according to one or more embodiments, showing an example appearance.

FIG. 12A is a perspective view of the switch lever 3 and the fixed member 5. FIG. 12B is a schematic left side view of the switch lever 3 and the fixed member 5. In FIGS. 12A and 12B, in response to the switch lever 3 being swung leftward (counterclockwise) as viewed in plan, the second conductive plate 321 is located away from the fixed member 5. In the state in FIGS. 12A and 12B, the second conductive plate 321 does not form the second capacitor together with the third fixed electrode 52 and the fourth fixed electrode 53. As the switch lever 3 moves in response to an operation, the second conductive plate 321 swings in a movable range thereof between the position shown in FIGS. 11A and 11B at which the second conductive plate 321 forms a capacitor together with the third fixed electrode 52 and the fourth fixed electrode 53, and the position shown in FIGS. 12A and 12B at which the second conductive plate 321 does not form a capacitor.

FIG. 13 is a block diagram conceptually showing an example of the second capacitor formed in the trigger switch TS according to one or more embodiments. The substrate as the fixed member 5 receives the controller 55 and the second detector 57 to detect a capacitance, both are mounted on or connected to the front surface of the fixed member 5. The third fixed electrode 52 is connected to the ground. The fourth fixed electrode 53 is connected to the second detector 57 to detect a capacitance. The second detector 57 is connected to the fourth fixed electrode 53 and the ground. The second detector 57 detects a capacitance of the second capacitor and outputs an electric signal indicating the detected capacitance to the controller 55. As shown in FIGS. 11A and 11B, the second conductive plate 321 indicated with solid lines in FIG. 13 is located adjacent to the third fixed electrode 52 and the fourth fixed electrode 53. With the second conductive plate 321 located adjacent to the third fixed electrode 52 and the fourth fixed electrode 53, the second conductive plate 321 and the third fixed electrode 52 form a capacitor, and the second conductive plate 321 and the fourth fixed electrode 53 form a capacitor. Hereafter, C3 is a capacitance of the capacitor formed by the third fixed electrode 52 and the second conductive plate 321, and C4 is a capacitance of the capacitor formed by the fourth fixed electrode 53 and the second conductive plate 321. The second capacitor, which is a synthetic capacitor, serves as an element including a capacitor having the capacitance C3 and a capacitor having the capacitance C4 connected with each other in series, and C34, a capacitance of the second capacitor, is written by the Formula 2 below.

$$C34=(C3 \times C4)/(C3+C4) \quad (2)$$

where C34 is the capacitance of the second capacitor,

C3 is the capacitance of the capacitor formed by the third fixed electrode 52 and the second conductive plate 321, and C4 is the capacitance of the capacitor formed by the fourth fixed electrode 53 and the second conductive plate 321.

As shown in FIGS. 12A and 12B, the second conductive plate 321 indicated with dashed lines in FIG. 13 is located away from the third fixed electrode 52 and the fourth fixed electrode 53. With the second conductive plate 321 away from the third fixed electrode 52 and the fourth fixed electrode 53, an effective capacitor is not formed. The second detector 57 thus detects a zero or close to zero capacitance.

Figure 14:
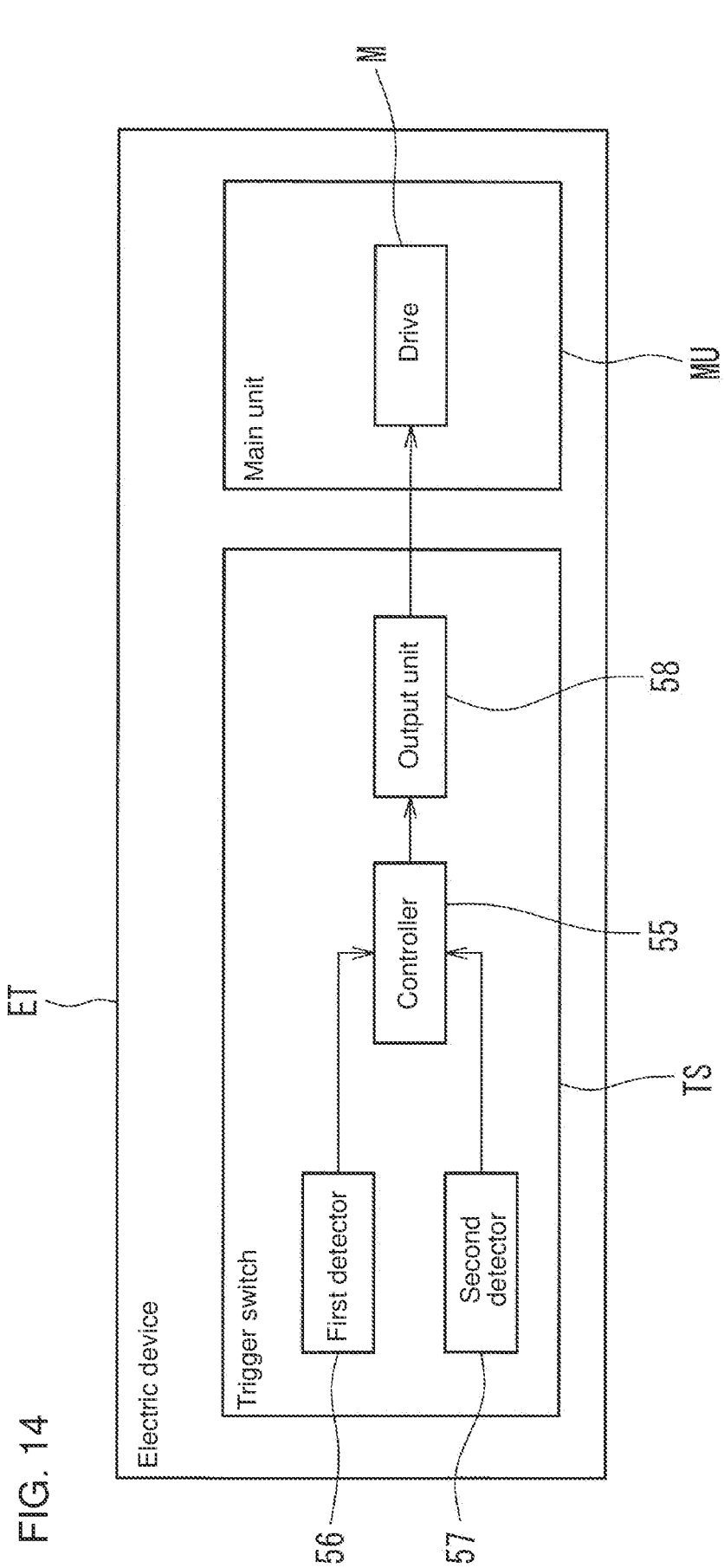
FIG. 14 is a schematic block diagram illustrating an electric device incorporating a trigger switch according to one or more embodiments, showing an example control configuration.

An example configuration of the electric device ET incorporating the trigger switch TS according to one or more embodiments will now be described. FIG. 14 is a schematic block diagram of the electric device ET incorporating the trigger switch TS according to one or more embodiments, showing an example control configuration. The electric device ET, such as a power tool, incorporates the trigger switch TS in a main unit MU. The main unit MU includes the drive M such as a motor. The trigger switch TS includes, in addition to the controller 55, the first detector 56, the second detector 57 described above, the output unit 58 for outputting an electric signal to the drive M under control by the controller 55.

The controller 55 in the trigger switch TS receives a capacitance of the first capacitor detected by the first detector 56 and a capacitance of the second capacitor detected by the second detector 57. The controller 55 determines an output of the drive M such as the rotation speed of the motor based on the capacitance of the first capacitor detected by the first detector 56. For example, when the capacitance of the first capacitor formed in response to a depressing operation on the trigger 1 increases, the controller 55 determines an output in accordance with the capacitance of the first capacitor receiving the depressing operation. The controller 55 determines a manner of driving the drive M, such as the rotation direction of the motor, based on the capacitance of the second capacitor detected by the second detector 57. For example, when the capacitance of the second capacitor formed in response to rightward operation on the switch lever 3 and detected by the second detector 57 exceeds a preset threshold, the controller 55 determines forward rotation of the motor. In response to leftward operation on the switch lever 3, the capacitance detected by the second detector 57 becomes less than the threshold. Accordingly, the controller 55 determines the reverse rotation of the motor.

The controller 55 in the trigger switch TS outputs, from the output unit 58 to the main unit MU, an electrical signal for driving the drive M in a manner of driving determined in accordance with the detection result from the second detector 57 with an output determined in accordance with the detection result from the first detector 56.

The main unit MU drives the drive M in response to the electrical signal input from the trigger switch TS.

Figure 15:
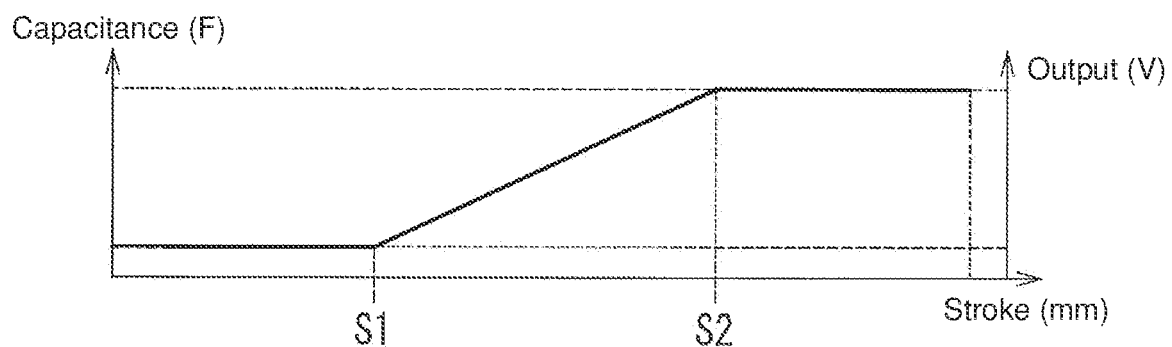
FIG. 15 is a diagram illustrating a graph conceptually showing an example of a relationship between a depression amount of a trigger, a capacitance, and an output in a trigger switch according to one or more embodiments.

FIG. 15 is a graph conceptually showing an example of the relationship between a depression amount of the trigger 1, a capacitance, and an output in the trigger switch TS according to one or more embodiments. In FIG. 15, the horizontal axis indicates a stroke value as the depression amount of the trigger 1, and the vertical axis indicates the capacitance of the first capacitor and the output value from the output unit 58 to the drive M. As shown in FIG. 7, when the trigger 1 is not depressed and has a zero stroke, the first conductive plate 40 does not form any capacitor together with the first fixed electrode 50 and the second fixed electrode 51, causing a zero capacitance and a zero output value from the output unit 58. As shown in FIG. 8, when the trigger 1 is depressed to a position S1, the first conductive plate 40 forms a capacitor together with the first fixed electrode 50 and the second fixed electrode 51. When the trigger 1 is further depressed, the capacitance of the capacitor formed by the second fixed electrode 51 and the first conductive plate 40 increases in accordance with the stroke value. The capacitance of the first capacitor, which is a synthetic capacitance, increases. FIG. 15 shows an example in which the output value increases at a constant slope with respect to the depression amount. As shown in FIG. 9, when the trigger 1 depressed to a position S2 is further depressed beyond the position S2, the controller 55 controls the output value within the range for constant-speed driving. The capacitance of the first capacitor does not increase at a constant slope with respect to a depression amount and increases slightly in response to the depressing operation beyond the position S2. However, to facilitate understanding, FIG. 15 conceptually shows the capacitance to be in accordance with the output value controlled by the controller 55.

As described above, in the trigger switch TS according to one or more embodiments, the first conductive plate 40 moves, in response to a depressing operation on the trigger 1, to form a capacitor together with the first fixed electrode 50 and the second fixed electrode 51 attached to the fixed member 5. For example, the second fixed electrode 51 is substantially a triangle allowing an electrode area forming a capacitor to change in accordance with the position of the first conductive plate 40 in a movable range thereof. Thus, the capacitance changes in accordance with the depression amount of the trigger 1. The trigger switch TS according to one or more embodiments can thus detect a depression amount of the trigger 1 through a capacitance. The trigger switch TS according to one or more embodiments can contactlessly detect the depression amount of the trigger 1 through a capacitance to produce advantageous effects including less friction damage and a long service life. Unlike contactless detection using a magnetic sensor, the trigger switch TS according to one or more embodiments can be, for example, unaffected by a magnetic field in the external environment.

In the trigger switch TS according to an embodiment of the present disclosure, the second conductive plate 321 attached to the switch lever 3 forms a capacitor together with the third fixed electrode 52 and the fourth fixed electrode 53 attached to the fixed member 5, and allows, for example, additional control including switching of the manner of driving.

One or more embodiments is not limited to the above embodiment and may be modified in various forms. The above embodiment is a mere example and may not limit one or more embodiments. One or more embodiments is defined not by the description given above but by the claims. Any modifications and alterations contained in the equivalency range of the claims fall within the scope.

Figure 16:
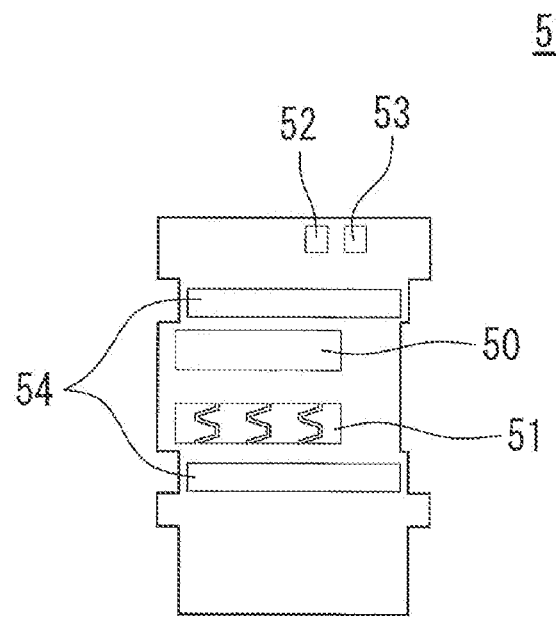
FIG. 16 is a diagram illustrating a schematic rear view of a fixed member in a trigger switch according to one or more embodiments, showing an example appearance.

For example, although the second fixed electrode 51 is a triangle allowing the electrode area forming a capacitor to gradually increase in the direction in which the movable member 4 moves in response to a depressing operation in the above embodiment, one or more embodiments is not limited to the embodiment but may be variously modified to include a second fixed electrode 51 in various shapes with a changeable electrode area. For example, the second fixed electrode 51 in the trigger switch TS according to one or more embodiments may have a triangular electrode area that gradually decreases in response to a depressing operation, or have a trapezoidal electrode area that first gradually increases and then remains constant. The second fixed electrode 51 in the trigger switch TS according to one or more embodiments may be further modified in various arrangements and shapes. FIG. 16 is a schematic rear view of a fixed member 5 in a trigger switch TS according to an embodiment of the present disclosure, showing an example appearance. The fixed member 5 in the trigger switch TS shown in FIG. 16 includes a second fixed electrode 51 including multiple thin metal plates aligned in the moving direction of a first conductive plate 40. The electrode area of the capacitor formed by the second fixed electrode 51 and the first conductive plate 40 also changes as the first conductive plate 40 moves. The second fixed electrode 51 may include such multiple thin metal plates. The electrode area may be modified in various arrangements and shapes to allow the electrode area to increase or decrease as the first conductive plate 40 moves. In other words, the trigger switch TS according to one or more embodiments may be modified in various arrangements and shapes to allow an electrode area forming a capacitor together with the first conductive plate 40 to change as the first conductive plate 40 moves.

For example, although the first conductive plate 40 forms the first capacitor together with the first fixed electrode 50 and the second fixed electrode 51 in the above embodiment, one or more embodiments is not limited to the embodiment but may be variously modified to include, for example, a triangular second fixed electrode 51 alone.

For example, although the manner of driving changed by the switch lever 3 is the rotation direction of the motor, as the drive M, between the forward rotation and the reverse rotation in the embodiment described above, one or more embodiments is not limited to the embodiment but may be used for switching between various manners of driving. For example, one or more embodiments may be variously modified to include switching of the speed mode with the switch lever 3 in the trigger switch TS according to one or more embodiments between a variable speed mode in which an output varies in accordance with the depression amount of the trigger 1, and a constant speed mode in which the output is constant independently of the depression amount of the trigger 1.

For example, although the trigger switch TS incorporates the first detector 56, the second detector 57, the controller 55, and the output unit 58 in the above embodiment, one or more embodiments is not limited to the embodiment but may be variously modified to include, for example, the controller 55 external to the housing 2 in the trigger switch TS but incorporated in the main unit MU.

The invention claimed is:

1. A trigger switch, comprising:
a trigger movable in response to a depressing operation;
a movable electrode movable in response to movement of the trigger receiving the depressing operation; and
a fixed electrode located adjacent to a movable range of the movable electrode, the fixed electrode forming a capacitor together with the movable electrode,
wherein a capacitance of the capacitor formed by the movable electrode and the fixed electrode changes as the movable electrode moves according to a depression amount of the trigger enabling the depression amount of the trigger corresponding to the capacitance to be contactlessly detected.

2. The trigger switch according to claim 1, wherein the fixed electrode has a shape to allow an electrode area forming a capacitor to change in accordance with a position of the movable electrode in the movable range of the movable electrode.

3. The trigger switch according to claim 2, wherein the fixed electrode has a shape to allow the electrode area forming a capacitor to gradually increase in a direction of movement in response to the depressing operation.

4. The trigger switch according to claim 1, further comprising:
an operation member movable in response to an operation;
a sub-movable electrode movable in response to movement of the operation member; and
a sub-fixed electrode configured to form a capacitor together with the sub-movable electrode in response to the sub-movable electrode moving to a position adjacent to the sub-fixed electrode,
wherein the sub-movable electrode moves in response to movement of the operation member in a movable range between a position at which the sub-movable electrode forms a capacitor together with the sub-fixed electrode and a position at which the sub-movable electrode does not form the capacitor together with the sub-fixed electrode.

5. The trigger switch according to claim 1, further comprising:
an output unit incorporatable into an electric device, the electric device including a drive drivable in response to an electric signal, the output unit being configured to output an electric signal to drive the drive with an output determined by the capacitance of the capacitor formed by the movable electrode and the fixed electrode.

6. The trigger switch according to claim 4, further comprising:
an output unit incorporatable into an electric device, the electric device including a drive drivable in response to an electric signal, the output unit being configured to output an electric signal to drive the drive with an output determined by the capacitance of the capacitor formed by the movable electrode and the fixed electrode, the output unit being configured to output an electric signal indicating a manner of driving the drive based on a capacitance of a capacitor formed by the sub-movable electrode and the sub-fixed electrode.

7. The trigger switch according to claim 2, further comprising:
an operation member movable in response to an operation;
a sub-movable electrode movable in response to movement of the operation member; and
a sub-fixed electrode configured to form a capacitor together with the sub-movable electrode in response to the sub-movable electrode moving to a position adjacent to the sub-fixed electrode,
wherein the sub-movable electrode moves in response to movement of the operation member in a movable range between a position at which the sub-movable electrode forms a capacitor together with the sub-fixed electrode and a position at which the sub-movable electrode does not form the capacitor together with the sub-fixed electrode.

8. The trigger switch according to claim 3, further comprising:
an operation member movable in response to an operation;
a sub-movable electrode movable in response to movement of the operation member; and
a sub-fixed electrode configured to form a capacitor together with the sub-movable electrode in response to the sub-movable electrode moving to a position adjacent to the sub-fixed electrode,
wherein the sub-movable electrode moves in response to movement of the operation member in a movable range between a position at which the sub-movable electrode forms a capacitor together with the sub-fixed electrode and a position at which the sub-movable electrode does not form the capacitor together with the sub-fixed electrode.

9. The trigger switch according to claim 2, further comprising:
an output unit incorporatable into an electric device, the electric device including a drive drivable in response to an electric signal, the output unit being configured to output an electric signal to drive the drive with an output determined by the capacitance of the capacitor formed by the movable electrode and the fixed electrode.

10. The trigger switch according to claim 3, further comprising:
an output unit incorporatable into an electric device, the electric device including a drive drivable in response to an electric signal, the output unit being configured to output an electric signal to drive the drive with an output determined by the capacitance of the capacitor formed by the movable electrode and the fixed electrode.

11. The trigger switch according to claim 4, further comprising:
an output unit incorporatable into an electric device, the electric device including a drive drivable in response to an electric signal, the output unit being configured to output an electric signal to drive the drive with an output determined by the capacitance of the capacitor formed by the movable electrode and the fixed electrode.

12. The trigger switch according to claim 7, further comprising:
an output unit incorporatable into an electric device, the electric device including a drive drivable in response to an electric signal, the output unit being configured to output an electric signal to drive the drive with an output determined by the capacitance of the capacitor formed by the movable electrode and the fixed electrode.

13. The trigger switch according to claim 8, further comprising:
an output unit incorporatable into an electric device, the electric device including a drive drivable in response to an electric signal, the output unit being configured to output an electric signal to drive the drive with an output determined by the capacitance of the capacitor formed by the movable electrode and the fixed electrode.

14. The trigger switch according to claim 7, further comprising:
an output unit incorporatable into an electric device, the electric device including a drive drivable in response to an electric signal, the output unit being configured to output an electric signal to drive the drive with an output determined by the capacitance of the capacitor formed by the movable electrode and the fixed electrode, the output unit being configured to output an electric signal indicating a manner of driving the drive based on a capacitance of a capacitor formed by the sub-movable electrode and the sub-fixed electrode.

15. The trigger switch according to claim 8, further comprising:
an output unit incorporatable into an electric device, the electric device including a drive drivable in response to an electric signal, the output unit being configured to output an electric signal to drive the drive with an output determined by the capacitance of the capacitor formed by the movable electrode and the fixed electrode, the output unit being configured to output an electric signal indicating a manner of driving the drive based on a capacitance of a capacitor formed by the sub-movable electrode and the sub-fixed electrode.

\* \* \* \* \*